(12) United States Patent
Yeon et al.

(10) Patent No.: US 9,369,618 B2
(45) Date of Patent: Jun. 14, 2016

(54) CAMERA MODULE HAVING FOREIGN OBJECT BLOCKING STRUCTURE AND A METHOD FOR ASSEMBLING THE SAME

(71) Applicant: LG INNOTEK CO., LTD., Seoul (KR)

(72) Inventors: Byoung Yun Yeon, Seoul (KR); Kyung Pil Chae, Seoul (KR); Cheol Woo Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/360,222

(22) PCT Filed: Nov. 26, 2012

(86) PCT No.: PCT/KR2012/010030
§ 371 (c)(1),
(2) Date: May 22, 2014

(87) PCT Pub. No.: WO2013/081339
PCT Pub. Date: Jun. 6, 2013

(65) Prior Publication Data
US 2014/0307099 A1 Oct. 16, 2014

(30) Foreign Application Priority Data

Nov. 29, 2011 (KR) .......... 10-2011-0125599
Nov. 29, 2011 (KR) .......... 10-2011-0125611

(51) Int. Cl.
*H04N 5/225* (2006.01)
*G03B 17/12* (2006.01)
*H04N 5/33* (2006.01)
*H05K 3/30* (2006.01)

(52) U.S. Cl.
CPC ............. *H04N 5/2253* (2013.01); *G03B 17/12* (2013.01); *H04N 5/2257* (2013.01); *H04N 5/33* (2013.01); *H05K 3/30* (2013.01); *Y10T 29/4913* (2015.01)

(58) Field of Classification Search
CPC .................................................. H04N 5/2253
USPC .......................................................... 348/374
See application file for complete search history.

(56) References Cited

U.S. PATENT DOCUMENTS

2007/0019702 A1\* 1/2007 Day et al. ............... 372/101
2008/0131112 A1\* 6/2008 Aoki et al. .............. 396/429

FOREIGN PATENT DOCUMENTS

| JP | 2005-241982 A | 9/2005 |
| JP | 2006-079871 A | 3/2006 |
| KR | 10-2011-0022285 A | 3/2011 |
| KR | 10-2011-0073043 A | 6/2011 |

OTHER PUBLICATIONS

International Search Report in International Application No. PCT/KR2012/010030, filed Nov. 26, 2012.

\* cited by examiner

*Primary Examiner* — Usman Khan
(74) *Attorney, Agent, or Firm* — Saliwanchik, Lloyd & Eisenschenk

(57) ABSTRACT

The present invention relates to a camera module, the camera module including a base formed at an upper surface of a PCB (Printed Circuit Board) mounted with an image sensor, and formed with an IRCF (Infrared Cut Filter) at a position corresponding to that of the image sensor, a bobbin vertically reciprocatively formed at an upper surface of the base, and having a bobbin screw thread at an upper surface, a lens barrel formed with a lens barrel screw thread at an outer surface for being screw-connected to an interior of the bobbin and mounted with at least one or more lenses, and a foreign object blocking unit formed at a screw-connected portion between the bobbin and the lens barrel to prevent sticky and adhesive foreign objects from being transmitted to an IRCF (Infrared Cut Filter) in the course of screw-connection between the lens barrel and the bobbin.

18 Claims, 3 Drawing Sheets

10; base
11; IRCF
20; bobbin
30; lens barrel
33; lens
21; bobbin screw thread
31; lens barrel screw thread
32; foreign object prevention auxiliary screw thread 10; base
11; IRCF
20; bobbin
30; lens barrel
33; lens
21; bobbin screw thread
31; lens barrel screw thread
32; foreign object prevention auxiliary screw thread

CAMERA MODULE HAVING FOREIGN OBJECT BLOCKING STRUCTURE AND A METHOD FOR ASSEMBLING THE SAME

CROSS-REFERENCE TO RELATED APPLICATIONS

This application is the U.S. national stage application of International Patent Application No. PCT/KR2012/010030, filed Nov. 26, 2012, which claims priority to Korean Application Nos. 10-2011-0125599 and 10-2011-0125611, filed Nov. 29, 2011, the disclosures of each of which are incorporated herein by reference in their entirety.

TECHNICAL FIELD

The teachings in accordance with exemplary embodiments of this invention relate generally to a camera module and a method for assembling the same.

BACKGROUND ART

Generally, a camera module is an optical device formed with a plurality of lenses for photographing an object through the lenses. The lenses are embedded in a lens barrel. The lens barrel is coupled to a holder, such as a bobbin, and the holder is attached to a substrate mounted with an image sensor. At this time, the lens barrel is moved to perform a focusing process to adjust a depth of focus between the lens embedded in the lens barrel and the image sensor (i.e., focusing of the lens barrel and the image sensor).

Conventionally, after the focusing process, in order to fix the lens barrel and the holder, an epoxy is coated between the lens barrel and the holder to allow the epoxy to cure. At this time, during epoxy coating process, inattention may occur of touching the lens barrel using a coating needle to generate a problem of twisting a lens focusing.

Furthermore, the lens barrel supporting the plurality of lenses is formed at an inner surface of the bobbin of a VCM (Voice Coil Motor) for auto focusing, and each of the inner surface of the bobbin and an outer surface of the lens barrel is formed with a screw thread, by which the bobbin and the lens barrel are screw-connected for mutual coupling.

Meanwhile, in the course of assembly process coupling the bobbin and the lens barrel through screw-connection, or in the course of adjusting a position of screw-connection of the bobbin and the lens barrel for auto focusing, sticky or adhesive foreign objects such as liquid foreign objects or burrs that may exist on screw threads may be transmitted to an IRCF (Infrared Cut Filter) arranged downstream of the lens barrel. The adhesion of these foreign objects to the IRCF may cause generation of defects to the camera module such as image pollution and the like.

DISCLOSURE OF INVENTION

Technical Problem

The present general inventive concept provides a camera module directed to solve the aforementioned problems or disadvantages, and it is an object of the present invention to provide a camera module capable of preventing a depth of focus between a lens and an image sensor from being twisted (i.e., preventing de-focusing) due to erroneous operation and product movement.

It is another object of the present invention to provide a camera module improved in structure capable of preventing sticky or adhesive foreign objects such as liquid foreign objects or burrs from being transmitted to an IRCF (Infrared Cut Filter) arranged downstream of a lens barrel in the course of screw-connecting the lens barrel to an inner surface of a bobbin.

Solution to Problem

According to a general aspect and an exemplary embodiment of the present invention, there is provided a camera module, the camera module comprising: a lens barrel including one more sheets of lenses receiving an optical image of an object, formed at an outer surface with a first spiral (helicoid), and formed at a partial region of the outer surface with a first spiral-removed region; a holder formed with an opening inserted by the lens barrel, and formed at an inner surface of the opening with a second spiral meshed with the first spiral; and a PCB (Printed Circuit Board) attached by the holder and mounted with an image sensor converting the optical image to an electrical signal, wherein an epoxy is filled in between the region removed of the first spiral and the holder.

Preferably, but not necessarily, the first spiral-removed region may be a D-cut region at a partial region at the outer surface of the lens barrel removed of a spiral.

Preferably, but not necessarily, the D-cut region may be formed at a part of the upper surface to allow a staircase sill to be formed by the D-cut region and a D-cut free region.

Preferably, but not necessarily, the epoxy may be an epoxy cured by light or heat, and may be provided by a UV (Ultraviolet) epoxy.

In another general aspect and an exemplary embodiment of the present invention, there is provided a method for assembling a camera module, the method comprising: coupling a lens barrel including one or more sheets of lenses receiving an optical image of an object to a holder; adhering the holder to a PCB (Printed Circuit Board) mounted with an image sensor; coating an epoxy between the lens barrel and the holder; performing a focusing process of matching a focus on the object through the lens to an incident surface of the image sensor; and curing the epoxy by irradiating light or heat to the epoxy.

Preferably, but not necessarily, the lens barrel and the holder may be screw-connected.

Preferably, but not necessarily, an outer surface of the lens barrel may be formed with a D-cut region, and the D-cut region may be positioned between the lens barrel and the holder, and the epoxy in the step of coating the epoxy between the lens barrel and the holder may be coated on the D-cut region.

Preferably, but not necessarily, the method my further comprises inspecting the focusing after the step of curing the epoxy by irradiating light or heat to the epoxy.

In still another general aspect and an exemplary embodiment of the present invention, there is provided a camera module, the camera module comprising: a base formed at an upper surface of a PCB (Printed Circuit Board) mounted with an image sensor, and formed with an IRCF (Infrared Cut Filter) at a position corresponding to that of the image sensor; a bobbin vertically reciprocatively formed at an upper surface of the base, and having a bobbin screw thread at an upper surface; a lens barrel formed with a lens barrel screw thread at an outer surface for being screw-connected to an interior of the bobbin and mounted with at least one or more lenses; and a foreign object blocking unit formed at a screw-connected portion between the bobbin and the lens barrel to prevent sticky and adhesive foreign objects from being transmitted to an IRCF (Infrared Cut Filter) in the course of screw-connection between the lens barrel and the bobbin.

Preferably, but not necessarily, the foreign object blocking unit may be formed between the lens barrel screw thread and the base, and may be preferably provided with a foreign object prevention auxiliary screw thread protrusively formed between a floor surface of the lens barrel and a screw thread of the lens barrel, and spaced apart from the bobbin screw thread at a predetermined distance.

Preferably, but not necessarily, the foreign object blocking unit may further include an adhesive member coated on a surface of the foreign object prevention auxiliary screw thread at a predetermined thickness.

Preferably, but not necessarily, the adhesive member may attach the bobbin screw thread to the foreign object blocking unit.

Preferably, but not necessarily, the foreign object prevention auxiliary screw thread may be spaced apart from the lens barrel screw thread and the floor surface of the lens barrel at a predetermined distance.

Preferably, but not necessarily, the foreign object blocking unit may further include a cutting screw thread additionally and protrusively formed downstream of the foreign object prevention auxiliary screw thread.

Preferably, but not necessarily, the adhesive member may be coated on the foreign object prevention auxiliary screw thread, but not coated on the cutting screw thread.

Preferably, but not necessarily, the foreign object prevention auxiliary screw thread may be protrusively formed at the lens barrel screw thread and a lens barrel outer surface spaced apart from the lens barrel floor surface at a predetermined distance, and an angle formed by an upper screw thread and the lens barrel outer surface is an acute angle.

Advantageous Effects of Invention

The present invention has an advantageous effect in that a structure and a method are realized capable of forming a first spiral-removed region at a lens barrel, and filling an epoxy between the first spiral-removed region and the lens barrel to perform a focusing process, whereby an erroneous operation during focusing process, and a twisted scope of depth of focus between a lens and an image sensor (i.e., focusing of a lens and an image sensor) caused by product movement can be prevented.

Another advantageous effect is that an auxiliary screw thread for preventing foreign objects generated in the course of screw-connection is formed at a lens barrel screw-connected to an inner surface of a bobbin, on which an adhesive member is coated for collecting foreign objects, whereby sticky or adhesive foreign objects such as liquid foreign objects or burrs are prevented from being transferred to an IRCF arranged downstream of the lens barrel.

BEST MODE FOR CARRYING OUT THE INVENTION

Now, a camera module and a method for assembling the camera module according to exemplary embodiments of the present invention will be described in detail with reference to the accompanying drawings.

Figure 1:
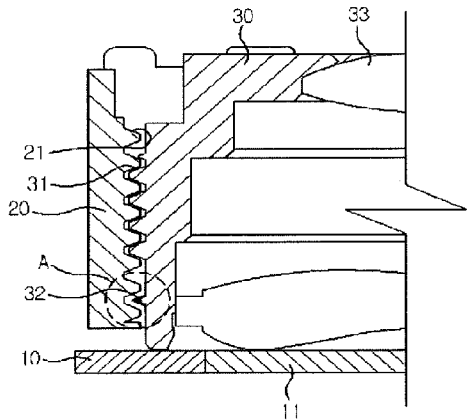
FIG. 1 is a cross-sectional view illustrating a schematic structure of a camera module according to the present invention.
Figure 2:
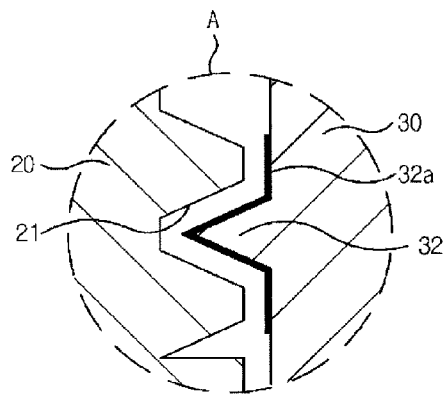
FIGS. 2, 3 and 4 are partial enlarged views of 'A' part of FIG. 1 according to mutually different exemplary embodiments of the present invention.
Figure 3:
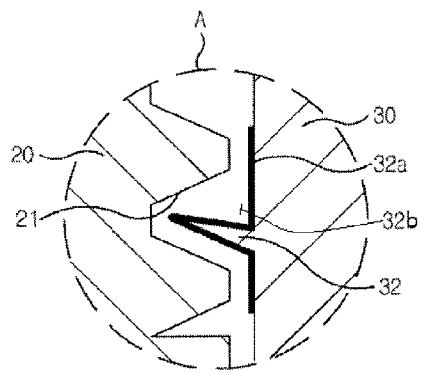
Figure 4:
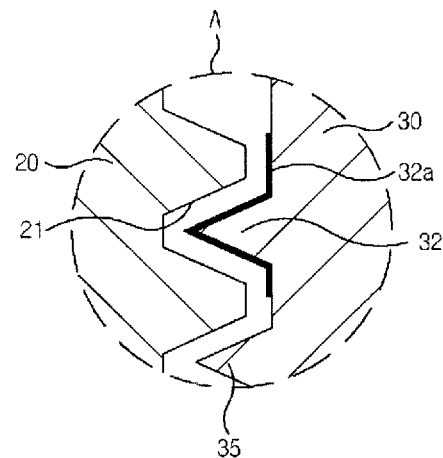

FIG. 1 is a cross-sectional view illustrating a schematic structure of a camera module according to the present invention, FIGS. 2, 3 and 4 are partial enlarged views of 'A' part of FIG. 1 according to mutually different exemplary embodiments of the present invention.

Referring to FIGS. 1 to 4, a camera module according to the present invention includes a base (10), a bobbin (20) and a lens barrel (30).

The base (10) is arranged at an upper surface of a PCB (Printed Circuit Board, not shown) and an IRCF (Infrared Cut Filter, 11) is arranged at a position corresponding to a position of an image sensor mounted on the PCB. The bobbin (20) is liftably arranged at an upper surface of the base (10), and the bobbin (20) is protrusively formed at a floor surface with a plurality of rib members (not shown) to surface-contact the base (10) at an initial position. The bobbin (20) is wound at an outer surface thereof with a coil (not shown), and in a case a current flows in the coil, a magnetic field is formed at the bobbin (20) to perform a reciprocative movement in response to an interaction with a magnet (not shown) mounted on a yoke (not shown).

The bobbin (20) is formed at an inner surface thereof with a bobbin screw thread (21) having a predetermined pitch, where the bobbin screw thread (21) is provided to screw-connect a lens barrel (30, described later). The lens barrel (30) is centrally formed to support at least one or more lenses (33), and is preferably shaped of a cylinder with an opening in the center. The lens barrel (30) is preferably formed at an outer surface with a lens barrel screw thread (31) having a corresponding screw pitch for screw-connection with the bobbin screw thread (21).

Meanwhile, a foreign object blocking unit according to the present invention includes a foreign object prevention auxiliary screw thread (32). The foreign object prevention auxiliary screw thread (32) smaller in size than the lens barrel screw thread (31) is preferably formed downstream of the lens barrel screw thread (31) formed at the lens barrel (30). The foreign object prevention auxiliary screw thread (32), being formed smaller in size than the bobbin screw thread (21) and the lens barrel screw thread (31), is not brought into contact with the bobbin screw thread (21) to be spaced apart at a predetermined distance, even if the bobbin screw thread (21) and the lens barrel screw thread (31) are mutually screw connected. Thus, the foreign object prevention auxiliary screw thread (32) has no influence at all on the screw-connection between the bobbin (20) and the lens barrel (30).

Furthermore, the foreign object prevention auxiliary screw thread (32) is formed downstream of the lens barrel screw thread (31) and upstream of a floor surface of the lens barrel (30), and, as illustrated in FIGS. 1 and 2, may be arranged at a mid section between the floor surface of the lens barrel (30) and the lens barrel screw thread (31).

Meanwhile, as illustrated in FIG. 2, a surface of the foreign object prevention auxiliary screw thread (32) may be coated with an adhesive member (32a) at a predetermined thickness, and at this time, the coated thickness of the adhesive member (32a) may be smaller than a distance between the bobbin screw thread (21) and the foreign object prevention auxiliary screw thread (32) to prevent the foreign object prevention auxiliary screw thread (32) from interfering with the bobbin (20) by the adhesive member (32a). However, it may be possible to fix the lens barrel (30) to the bobbin (20) using the adhesive member (32a).

Meanwhile, as illustrated in FIG. 3, the foreign object prevention auxiliary screw thread (32) may be so formed as to allow an angle formed by an upper surface of the screw thread and an outer surface of the lens barrel at an acute angle. At this time, a concave groove (32b) may be formed at a point where an upper surface of the foreign object prevention auxiliary screw thread (32) and an outer surface of the lens barrel (30), whereby pollutant materials such as minute particles generated in the course of the screw-connection between the bobbin (20) and the lens barrel (30) can be collected by the concave groove (32b).

Now, referring to FIG. 4, the foreign object prevention auxiliary screw thread (32) may be additionally formed at a bottom surface with a cutting (blocking) screw thread (35). The cutting (blocking) screw thread (35) serves as a blocking wall for preventing the adhesive member (32a) coated on the foreign object prevention auxiliary screw thread (32) from flowing down and dropping down to the bobbin (20) and the lens barrel (30).

According to the present invention thus described and configured, liquid or sticky adhesive foreign objects generated in the course of screw-connection between the bobbin (20) and the lens barrel (30) can be collected by the foreign object prevention auxiliary screw thread (32) and the adhesive member (32a) coated thereon.

Thus, the IRCF (11) is prevented from being polluted by foreign objects possibly generated in the course of screw-connection between the bobbin (20) and the lens barrel (30) and transferred to the IRCF (11) down through the lens barrel screw thread (31).

Figure 5:
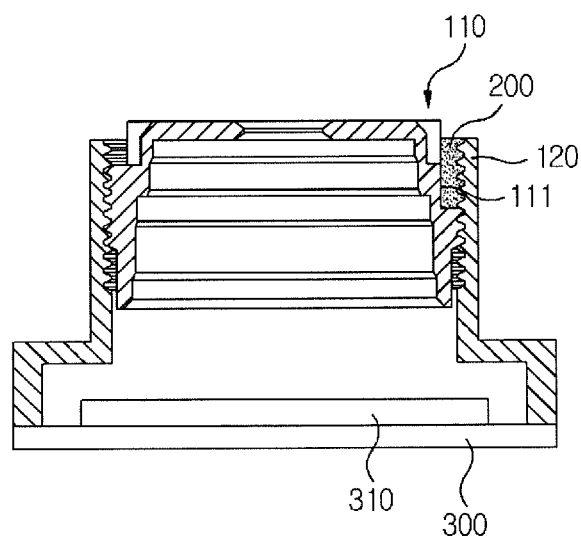
FIG. 5 is a schematic cross-sectional view of a camera module according to an exemplary embodiment of the present invention.
Figure 6:
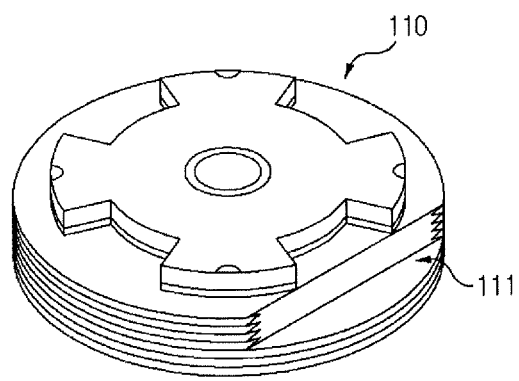
FIG. 6 is a perspective view of a lens barrel of a camera module according to an exemplary embodiment of the present invention.

FIG. 5 is a schematic cross-sectional view of a camera module according to an exemplary embodiment of the present invention, and FIG. 6 is a perspective view of a lens barrel of a camera module according to an exemplary embodiment of the present invention.

The camera module according to the present invention includes a lens barrel (110) including one more sheets of lenses receiving an optical image of an object, formed at an outer surface with a first spiral, and formed at a partial region of the outer surface with a first spiral-removed region; a holder (120) formed with an opening inserted by the lens barrel (110), and formed at an inner surface of the opening with a second spiral meshed with the first spiral; and a PCB (Printed Circuit Board, 300) attached by the holder (120) and mounted with an image sensor (310) converting the optical image to an electrical signal, wherein an epoxy is filled in between the first spiral-removed region and the holder (120).

Thus, the present invention can realize a structure where the lens barrel (10) is formed with a first spiral-removed region, and an epoxy is filled in between the first spiral-removed region and the holder (120) to perform a focusing process, whereby an erroneous operation during the focusing process, and a twisted scope of depth of focus between a lens and an image sensor (i.e., focusing of a lens and an image sensor) caused by product movement can be prevented.

At this time, the first spiral-removed region may be a D-cut region (111) at a partial region at the outer surface of the lens barrel (110) removed of a spiral.

The D-cut region may be formed at a part of the upper surface to allow a staircase sill to be formed by the D-cut region and a D-cut free region. That is, the D-cut region is formed with the staircase sill to prevent the epoxy from flowing down in a case the epoxy is coated. Furthermore, the epoxy may be an epoxy cured by light or heat, and the epoxy may be a UV (Ultraviolet) epoxy through fast curing (hardening) method. In addition, the first spiral-remove region is preferably formed at an object side of the lens barrel (110).

Mode for the Invention

Figure 7:
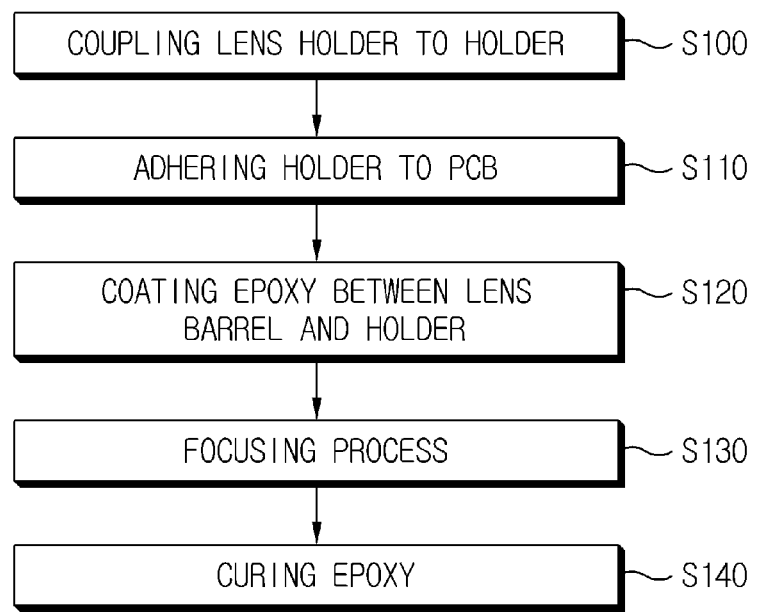
FIG. 7 is a flowchart illustrating a method for assembling a camera module according to an exemplary embodiment of the present invention.

FIG. 7 is a flowchart illustrating a method for assembling a camera module according to an exemplary embodiment of the present invention.

First, a lens barrel including one or more sheets of lenses receiving an optical image of an object is coupled to a holder (S100), where the lens barrel and the holder are screw-connected. Successively, the holder is adhered to a PCB (Printed Circuit Board) mounted with an image sensor (S110). Thereafter, an epoxy is coated between the lens barrel and the holder (S120). At this time, an outer surface of the lens barrel is formed with a D-cut region, and the D-cut region is positioned between the lens barrel and the holder, and the epoxy is coated on the D-cut region.

Successively, a focusing process is performed of matching a focus on the object through the lens to an incident surface of the image sensor (S130). Then, the epoxy is cured by irradiating light or heat to the epoxy (S140).

Thus, the present invention can prevent an erroneous operation and a twisted lens focus by performing a lens focusing after coating the epoxy between the lens barrel and the holder. A step of inspecting the focusing may be further performed after the step of curing the epoxy by irradiating light or heat to the epoxy.

The previous description of the present invention is provided to enable any person skilled in the art to make or use the invention. Various modifications to the invention will be readily apparent to those skilled in the art, and the generic principles defined herein may be applied to other variations without departing from the spirit or scope of the invention. Thus, the invention is not intended to limit the examples described herein, but is to be accorded the widest scope consistent with the principles and novel features disclosed herein.

INDUSTRIAL APPLICABILITY

The camera module according to the present invention has an industrial applicability in that it can be applied to a small-sized camera module mounted on small electronic devices such as a portable terminal, and a tablet PC.

The invention claimed is:

1. A camera module having a foreign object blocking structure, the camera module comprising:
 a base arranged on an upper surface of a Printed Circuit Board (PCB) mounted with an image sensor, and arranged with an Infrared Cut Filter (IRCF) at a position corresponding to that of the image sensor;
 a bobbin arranged over the base, and having a bobbin screw thread at an inner surface of the bobbin;
 a lens barrel formed with a lens barrel screw thread at an outer surface for being screw-connected to the bobbin screw thread of the bobbin and mounted with at least one lens; and a foreign object blocking unit formed downstream of the lens barrel screw thread and upstream of a floor surface of the lens barrel, wherein the foreign object blocking unit protrudes toward the bobbin screw thread of the bobbin, and wherein the foreign object blocking unit includes a foreign object prevention auxiliary screw thread formed between the floor surface of the lens barrel and the screw thread of the lens barrel, the foreign object prevention auxiliary screw thread having a size smaller than a size of the screw thread of the lens barrel.

2. The camera module of claim 1, wherein the foreign object blocking unit is disposed between the lens barrel screw thread and a floor surface of the bobbin.

3. The camera module of claim 2, wherein an adhesive member is coated on a surface of the foreign object prevention auxiliary screw thread with a predetermined thickness.

4. The camera module of claim 3, wherein the adhesive member attaches the bobbin to the lens barrel.

5. The camera module of claim 2, wherein the foreign object prevention auxiliary screw thread is protrusively formed at an outer surface of the lens barrel and arranged at a midsection between the lens barrel screw thread and the floor surface of the lens barrel.

6. The camera module of claim 5, further comprising a cutting screw thread additionally and protrusively formed downstream of the foreign object prevention auxiliary screw thread.

7. The camera module of claim 6, wherein an adhesive member is coated on the foreign object prevention auxiliary screw thread, but not coated on the cutting screw thread.

8. The camera module of claim 3, wherein a concave groove is formed between an upper surface of the foreign object prevention auxiliary screw thread and an outer surface of the lens barrel.

9. The camera module of claim 8, wherein an angle formed by the upper surface of the foreign object prevention auxiliary screw thread and the outer surface of the lens barrel is an acute angle.

10. The camera module of claim 3, wherein the adhesive member has a thickness smaller than a distance between the bobbin screw thread and the foreign object prevention auxiliary screw thread.

11. The camera module of claim 2, wherein the foreign object prevention auxiliary screw thread is formed with a size smaller than that of the bobbin screw thread and that of the lens barrel screw thread, so that the foreign object prevention auxiliary screw thread is not brought into contact with the bobbin screw thread to be spaced apart at a predetermined distance.

12. A camera module, the camera module comprising:
a lens barrel including one or more sheets of lenses and formed at an outer surface with a first spiral, and formed at a partial region of the outer surface with a first spiral-removed region;

a holder formed with an opening inserted by the lens barrel, and formed at an inner surface of the opening with a second spiral corresponding to the first spiral such that the lens barrel and the holder are screw-connected; and a Printed Circuit Board (PCB) attached by the holder and mounted with an image sensor, wherein an epoxy is disposed between the first spiral-removed region and the holder such that the screw-connected lens barrel and the holder are spaced apart at the first spiral-removed region for inhibiting erroneous focusing operations, and wherein the first spiral-removed region includes a D-cut region at a partial region at the outer surface of the lens barrel with a spiral removed.

13. The camera module of claim 12, wherein the D-cut region is formed at a part of an upper surface to allow a staircase sill to be formed by the D-cut region and a D-cut free region.

14. The camera module of claim 12, wherein the epoxy is an epoxy cured by light or heat.

15. The camera module of claim 12, wherein the epoxy is a Ultraviolet (UV) epoxy.

16. A method for assembling a camera module, the method comprising:
forming a first spiral and a first spiral-removed region on an outer surface of a lens barrel;

forming a D-cut region at a partial region of the outer surface of the lens barrel with the first spiral removed;

coupling the lens barrel including one or more sheets of lenses receiving an optical image of an object to a holder formed with a second spiral corresponding to the first spiral of the lens barrel such that the lens barrel and the holder are screw-connected;

adhering the holder to a Printed Circuit Board (PCB) mounted with an image sensor;

coating an epoxy between the first spiral-removed region of the lens barrel and the holder such that the screw-connected lens barrel and the holder are spaced apart at the first region for inhibiting erroneous focusing operations;

performing a focusing process of matching a focus on the object through the lens to an incident surface of the image sensor; and curing the epoxy by irradiating light or heat to the epoxy.

17. The method of claim 16, wherein the D-cut region is positioned between the lens barrel and the holder and is coated with the epoxy in the step of coating the epoxy between the lens barrel and the holder.

18. The method of claim 16, further comprising a step of inspecting the focusing process after the step of curing the epoxy by irradiating light or heat to the epoxy.

* * * * *